(12) United States Patent
Weng et al.

(10) Patent No.: US 9,336,416 B2
(45) Date of Patent: May 10, 2016

(54) METHODS OF HYDRAULICALLY FRACTURING A SUBTERRANEAN FORMATION

(71) Applicant: Schlumberger Technology Corporation, Sugar Land, TX (US)

(72) Inventors: Xiaowei Weng, Katy, TX (US); Edward Siebrits, Salt Lake City, UT (US)

(73) Assignee: Schlumberger Technology Corporation, Sugar Land, TX (US)

( * ) Notice: Subject to any disclaimer, the term of this patent is extended or adjusted under 35 U.S.C. 154(b) by 369 days.

(21) Appl. No.: 13/956,471

(22) Filed: Aug. 1, 2013

(65) Prior Publication Data

US 2014/0136173 A1    May 15, 2014

Related U.S. Application Data

(63) Continuation of application No. 13/586,158, filed on Aug. 15, 2012, now Pat. No. 8,571,843, which is a continuation of application No. 11/936,344, filed on Nov. 7, 2007, now Pat. No. 8,412,500.

(60) Provisional application No. 60/887,008, filed on Jan. 29, 2007.

(51) Int. Cl.
*G06G 7/48* (2006.01)
*G06G 7/50* (2006.01)
(Continued)

(52) U.S. Cl.
CPC ........ *G06G 7/50* (2013.01); *E21B 43/26* (2013.01); *G06G 7/57* (2013.01)

(58) Field of Classification Search
CPC ......... E21B 47/00; E21B 49/00; E21B 43/26; G06F 7/60; G06F 17/10; G06G 7/48; G06G 7/50; G06G 7/57; G01S 13/00

USPC ............... 703/2, 10; 166/250.1, 280.1, 308.1, 166/279; 175/50; 507/213, 202; 702/6
See application file for complete search history.

(56) References Cited

U.S. PATENT DOCUMENTS

| 4,584,874 A | 4/1986 | Ruhovets |
| 5,070,457 A | 12/1991 | Poulsen |

(Continued)

FOREIGN PATENT DOCUMENTS

WO    WO2008093264 A1    8/2008

OTHER PUBLICATIONS

Daboul et al., "Verbesserung Der Produktionsvorhersage Von Gefracten Gasbohrungen Durch Simulation = Improved Production Forecast of Fractured Gas Wells by 3D-Reservoir Simulation", Erdoel Erdgas Kohl, vol. 112(2); English Abstract, pp. 66-69.

(Continued)

*Primary Examiner* — Kandasamy Thangavelu
(74) *Attorney, Agent, or Firm* — Rachel E. Greene; Tim Curington

(57) ABSTRACT

A hydraulic fracture design model that simulates the complex physical process of fracture propagation in the earth driven by the injected fluid through a wellbore. An objective in the model is to adhere with the laws of physics governing the surface deformation of the created fracture subjected to the fluid pressure, the fluid flow in the gap formed by the opposing fracture surfaces, the propagation of the fracture front, the transport of the proppant in the fracture carried by the fluid, and the leakoff of the fracturing fluid into the permeable rock. The models used in accordance with methods of the invention are typically based on the assumptions and the mathematical equations for the conventional 2D or P3D models, and further take into account the network of jointed fracture segments. For each fracture segment, the mathematical equations governing the fracture deformation and fluid flow apply. For each time step, the model predicts the incremental growth of the branch tips and the pressure and flow rate distribution in the system by solving the governing equations and satisfying the boundary conditions at the fracture tips, wellbore and connected branch joints. An iterative technique is used to obtain the solution of this highly nonlinear and complex problem.

27 Claims, 3 Drawing Sheets

(51) Int. Cl.
*E21B 43/26* (2006.01)
*G06G 7/57* (2006.01)

(56) References Cited

U.S. PATENT DOCUMENTS

| | | | |
|---|---|---|---|
| 5,170,378 | A | 12/1992 | Mellor et al. |
| 5,279,366 | A | 1/1994 | Scholes |
| 5,551,516 | A | 9/1996 | Norman et al. |
| 6,435,277 | B1 | 8/2002 | Qu et al. |
| 6,508,307 | B1 | 1/2003 | Almaguer |
| 6,703,352 | B2 | 3/2004 | Dahayanake et al. |
| 6,876,959 | B1 | 4/2005 | Peirce et al. |
| 7,714,741 | B2 | 5/2010 | Snider et al. |
| 7,908,230 | B2 | 3/2011 | Bailey et al. |
| 7,925,482 | B2 | 4/2011 | Kennon et al. |
| 2002/0120429 | A1* | 8/2002 | Ortoleva ............. E21B 41/0064 703/2 |
| 2004/0209780 | A1 | 10/2004 | Harris et al. |
| 2004/0241232 | A1 | 12/2004 | Brown et al. |
| 2005/0058606 | A1 | 3/2005 | Six et al. |
| 2005/0216198 | A1 | 9/2005 | Craig |
| 2005/0234648 | A1 | 10/2005 | Economides et al. |
| 2005/0284637 | A1 | 12/2005 | Stegent et al. |
| 2006/0015310 | A1 | 1/2006 | Husen et al. |
| 2006/0102345 | A1 | 5/2006 | McCarthy et al. |
| 2006/0224370 | A1* | 10/2006 | Siebrits ................... E21B 43/26 703/10 |
| 2006/0272860 | A1 | 12/2006 | Sweatman et al. |
| 2007/0102155 | A1 | 5/2007 | Chan et al. |
| 2007/0272407 | A1* | 11/2007 | Lehman .................. E21B 49/00 166/250.1 |
| 2007/0294034 | A1 | 12/2007 | Bratton et al. |
| 2008/0062036 | A1* | 3/2008 | Funk ........................ E21B 29/06 342/22 |
| 2008/0066909 | A1 | 3/2008 | Hutchins et al. |
| 2008/0081771 | A1 | 4/2008 | Lin et al. |
| 2008/0087428 | A1 | 4/2008 | Symington et al. |
| 2008/0093073 | A1 | 4/2008 | Bustos et al. |
| 2008/0133186 | A1* | 6/2008 | Li ......................... G06F 17/5018 703/2 |
| 2008/0176770 | A1 | 7/2008 | Sanders et al. |
| 2008/0190603 | A1* | 8/2008 | Brannon ............... E21B 49/008 166/250.1 |

OTHER PUBLICATIONS

Ely, John W., "Stimulation Engineering Handbook", Pennwell Publishing Co., 1994, 368 pages.

Fisher et al., "Integrating Fracture Mapping Technologies to Optimize Stimulations in the Barnett Shale", SPE 77441, SPE Annual Technical Conference and Exhibition, 2002, 7 pages.

Geertsma et al., "A Rapid Method of Predicting Width and Extent of Hydraulic Induced Fractures", SPE 2458, Journal of Petroleum Technology, vol. 21, Dec. 1969, pp. 1571-1581.

Gu et al., "Computer Simulation of Multilayer Hydraulic Fractures", SPE 64789, International Conference of Oil and Gas in Beijing, China, Nov. 7-10, 2000, 12 pages.

Johnson et al., "Large-Volume, High• Rate, Stimulation Treatments in Horizontal Wells in the Niobrara Formation", SPE 25926, Presented at SPE Rocky Mountain Regional/Low Permeability Reservoirs Symposium, Apr. 1993, 14 pages.

Kirk et al., "Nuts", Encyclopedia of Chemical Technology, Third Edition, John Wiley & Sons, vol. 16, 1981, pp. 248-273.

Leung, K.H., "3D Numerical Simulation of Hydraulic Fracture Closure with Application to Minifracture Analysis", SPE 20657, Journal of Petroleum Technology, vol. 45(3), 1993, pp. 206-211, 255.

Mark et al., "Oilfield Applications", Encyclopedia of Polymer Science and Engineering, vol. 10, John Wiley and Sons, Inc., 1987, pp. 328-366.

Perkins et al., "Widths of Hydraulic Fractures", SPE 89, Journal of Petroleum Technology, vol. 13. (9), Sep. 1961, pp. 937-947.

Siebrits et al., "Refracture Reorientation Enhances Gas Production in Barnett Shale Tight Gas Wells", SPE 63030, Society of Petroleum Engineers, SPE Annual Technical conference and Exhibition in Dallas, Texas, Oct. 1-4, 2000, pp. 1-7.

Valencia et al., "Optimizing Stimulation of Coalbed Methane Reservoirs Using an Integrated Fracture Modeling Approach", SPE 93245, Asia Pacific Oil and Gas Conference and Exhibition, Jakarta, Indonesia, Apr. 5-7, 2005, 7 pages.

Weng et al., "Effect of Production-Induced Stress Field on Refracture Propagation and Pressure Response", SPE 106043, Hydraulic Fracturing Technology Conference, Jan. 29-31, 2007, 9 pages.

Brown, J.E., and Presmyk, C., "Horizontal Advisor—The Key to Maximizing Horizontal Production", Reservoir Symposium 2007, Schlumberger, 2007: pp. 1-10.

International Search Report of PCT Application No. PCT/IB2011/055997 dated Aug. 7, 2012.

International Search Report of PCT Application No. PCT/IB2008/050259 dated Jun. 24, 2008.

Alekseyenko et al., "Certain aspects of a two-dimensional problem on the hydraulic fracturing of an elastic medium", Journal of mining science, 1999.

\* cited by examiner

METHODS OF HYDRAULICALLY FRACTURING A SUBTERRANEAN FORMATION

CROSS REFERENCE TO RELATED APPLICATION

This application is a continuation of U.S. patent application Ser. No. 13/586,158 filed Aug. 15, 2012, which claims the benefit of U.S. patent application Ser. No. 11/936,344, filed Nov. 7, 2007, which claims the benefit of U.S. Provisional Application Ser. No. 60/887,008, filed Jan. 29, 2007, the entirety of each of which are hereby incorporated by reference.

FIELD OF THE INVENTION

This invention relates to methods of treating subterranean formations, and particularly, methods for fracture treatments performed on naturally fractured formations.

BACKGROUND OF THE INVENTION

The statements in this section merely provide background information related to the present disclosure and may not constitute prior art.

Hydraulic fracturing is the most widely used well stimulation method to enhance hydrocarbon production from oil or gas wells. To achieve the best economical result from a hydraulic fracturing treatment, modern day fracturing treatments commonly involve an extensive design process of acquiring pertinent formation mechanical and stress data, selection of proper fracturing fluid and propping agents, and designing the pumping schedule using a design model. The fracture design model plays a critical role which is to ensure the selected fluids and proppant, their amount, the pump rate and the proppant concentration schedule are all adequate to allow successful proppant placement without premature screenout (or proppant bridging) and to achieve the desired fracture length and conductivity.

Most, if not all, current commercial hydraulic fracture models are based on the assumption of a single hydraulic fracture plane being created in the formation being treated. The fracture initiates from the wellbore and grows in length and height over time as the fluid and proppant are injected into the fracture. The in-situ stress condition in the reservoir is such that there is generally a minimum stress among the three stress components, and the created hydraulic fracture tends to propagate in the plane normal to the minimum stress. This single planar fracture assumption is generally adequate for fracturing treatments in a formation consisting of laterally homogeneous layers.

In recent years, however, fracturing stimulation activities have increased in the unconventional gas shale formations, which contain very large gas reserves. These formations often have extremely low matrix permeability, but contain a large number of natural fractures which provide the apparent permeability for the gas production. Due to the nature of very low permeability, these formations cannot produce without hydraulic fracture stimulation. One of the most successful fracturing techniques applied in gas shale formations to date is the so-called slick water light sand treatment, i.e., a fracture treatment that pumps a very large volume of low-cost slick water with very low proppant concentration. Microseismic mapping conducted during these treatments indicated that a complex network of crisscrossing fractures are created, resulting from the hydraulic fracturing fluid penetrating the existing natural fracture network. Shown in FIG. 1 is microseismic mapping of fracture structures from a treatment in Barnett Shale as reported in Fisher, M. K., Wright, C. A., Davidson, B. M., Goodwin, A. K., Fielder, E. O., Buckler, W. S., and Steinsberger, N. P., "Integrating Fracture Mapping Technologies to Optimize Stimulations in the Barnett Shale," paper SPE 77441, 2002 SPE Annual Technical Conference and Exhibition, San Antonio, September 29-October 2.

The complex fracture geometry created during these treatments renders the traditional single fracture model completely inadequate in terms of its ability to predict the fracture size or surface area created or the sand placement. While it has been qualitatively established that the gas production of a stimulated well is proportional to the area extent of the created fracture network based on the microseismic measurements, current design tools are not adequate for designing such jobs.

Early hydraulic fracture models are the so-called 2D models. The most widely used 2D models are those described by Perkins, T. K. and Kern, L. R., "Widths of Hydraulic Fractures," paper SPE 89, Journal of Petroleum Technology (September 1961) 13, No. 9, p. 937-947, which later was extended by Nordren (called PKN model), and by Khristianovich and Geertsma and de Klerk (called KGD model), Geertsma, J. and de Klerk, F., "A Rapid Method of Predicting Width and Extent of Hydraulic Induced Fractures," paper SPE 2458, Journal of Petroleum Technology (December 1969) 21, 1571-1581. These 2D models consider either a vertical fracture of constant height or a penny-shaped fracture. The 2D models simplify the fracture geometry and reduce the fracture growth to one dimension (either length or radius), making the problem much simpler to solve. The 2D models are suitable to a formation with strong stress barriers above and below to contain the fracture in the zone (typically a sandstone sandwiched between the shales), or a radial fracture propagating in a formation with no stress barriers.

Modern hydraulic fracturing simulators are based on Pseudo-3D (P3D) or full planar 3D models to properly account for fracture height growth. The planar 3D models solve numerically the full set of 3D governing equations to predict the fracture dimensions and the proppant placement in the fracture. These models are computationally intensive and require long computation time, making them less suitable for daily quick job design needs. With today's faster desktop computers, they are increasingly utilized, especially for complex reservoirs where simpler models are not adequate. Most of the commercial fracture design software packages today are based on the P3D models. These models are extensions of the PKN model by considering the fracture height growth. However, the fracture geometry is limited to an ellipse-like shape, and 2D approximation of the fracture surface deformation is made instead of accurately solving the much more complex 3D fracture surface deformation.

Most typical design models simulate a single planar fracture. No fracture branching or interaction with existing natural fractures are possible, which are essential features required in order to simulate the complex fracturing process in the shale gas formation. For a hydraulic fracture system that contains many jointed branches, the lateral fracture penetration is significantly reduced for a given volume of fluid, simply due to mass balance. The fluid loss into the surrounding rock matrix also increases due to the increased surface area, further reducing the fracture penetration. Therefore, the single fracture design model may not provide adequate prediction of the job outcome.

Therefore, there is a need for methods of fracturing naturally fractured subterranean formation using tools which adequately model a fracture network in such formations. This need is met, at least in part, by the following invention.

DESCRIPTION OF THE INVENTION

Figure 1:
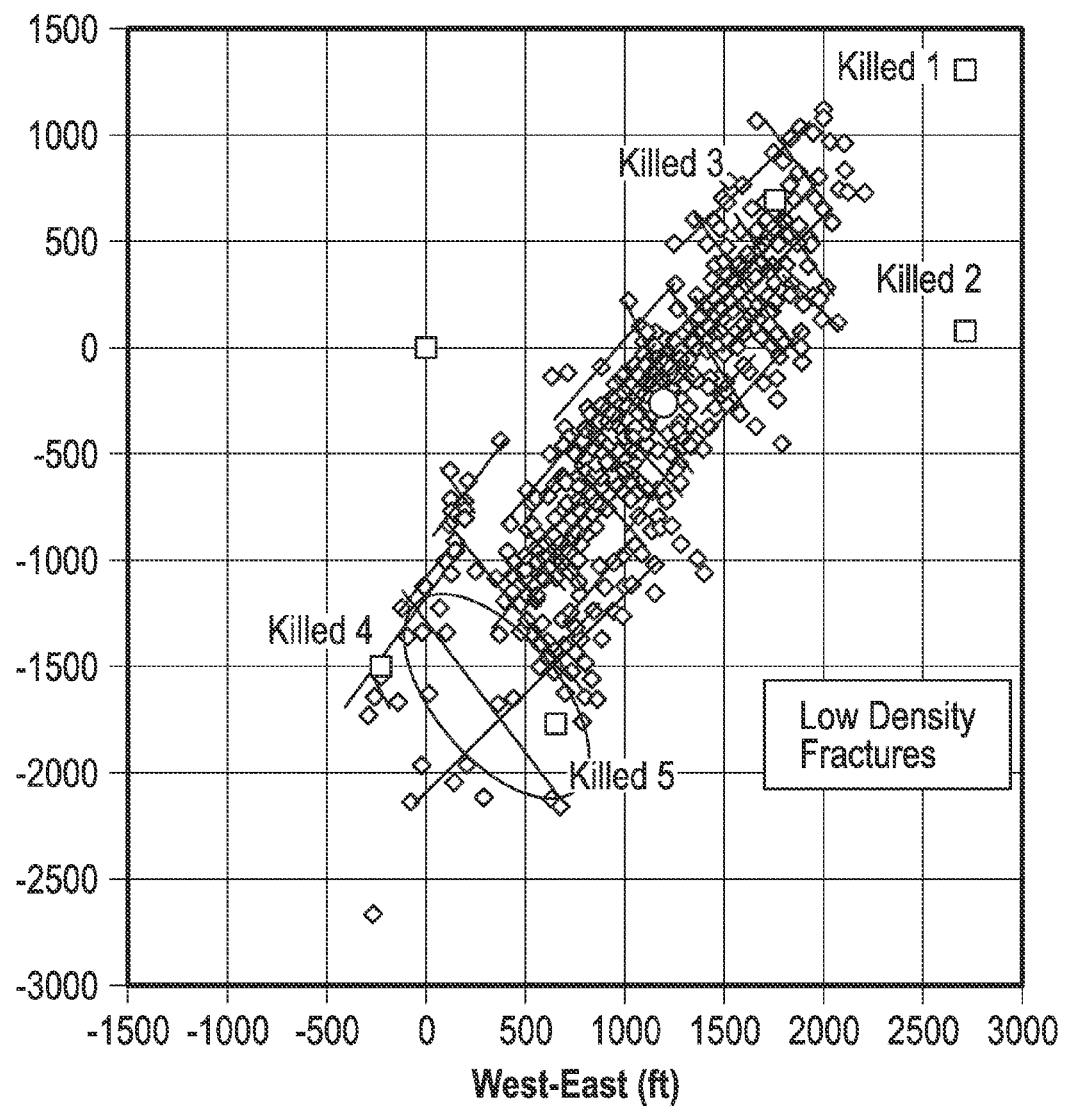
FIG. 1 is a representation of microseismic mapping of fracture structures from a treatment in Barnett Shale.

At the outset, it should be noted that in the development of any such actual embodiment, numerous implementation-specific decisions must be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure.

The description and examples are presented solely for the purpose of illustrating the preferred embodiments of the invention and should not be construed as a limitation to the scope and applicability of the invention. While the compositions used in methods of the invention may be described herein as comprising certain materials, it should be understood that the composition could optionally comprise two or more chemically different materials. In addition, the composition can also comprise some components other than those cited. In the summary of the invention and this detailed description, each numerical value should be read once as modified by the term "about" (unless already expressly so modified), and then read again as not so modified unless otherwise indicated in context. Also, in the summary of the invention and this detailed description, it should be understood that a concentration range listed or described as being useful, suitable, or the like, is intended that any and every concentration within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to only a few specific, it is to be understood that inventors appreciate and understand that any and all data points within the range are to be considered to have been specified, and that inventors possession of the entire range and all points within the range.

This invention relates to methods of treating subterranean formations, and particularly, methods for fracture treatments performed on naturally fractured formations. Embodiments of the invention incorporate a hydraulic fracture design model that can adequately simulate the propagation of a complex hydraulic fracture network and the interaction with the existing natural fracture network.

A hydraulic fracture model is a mathematical model that simulates the complex physical process of fracture propagation in the earth driven by the injected fluid through a wellbore. An objective in the model is to adhere with the laws of physics governing the surface deformation of the created fracture subjected to the fluid pressure, the fluid flow in the gap formed by the opposing fracture surfaces, the propagation of the fracture front, the transport of the proppant in the fracture carried by the fluid, and the leakoff of the fracturing fluid into the permeable rock. Due to the complexity and highly nonlinear nature of the formulated mathematical problem, it is solved through a numerical method.

The models used in accordance with methods of the invention are based on the assumptions and the mathematical equations for the conventional 2D or P3D models, and further take into account the network of jointed fracture segments. For each fracture segment, the mathematical equations governing the fracture deformation and fluid flow apply. For each time step, the model predicts the incremental growth of the branch tips and the pressure and flow rate distribution in the system by solving the governing equations and satisfying the boundary conditions at the fracture tips, wellbore and connected branch joints. An iterative technique is used to obtain the solution of this highly nonlinear and complex problem. The user can utilize these types of fracture models in conjunction with other engineering tools that provide the formation mechanical properties and adequate characterization of the natural fractures to generate a quantitative prediction of the fracture dimension and the potential production increase resulting from the fracture stimulation.

For a formation at depth, the in-situ stresses in the earth are generally such that the vertical overburden stress is greater than the horizontal stress components. As a result, the hydraulic fractures are generally vertical cracks in the formation being treated. When a hydraulic fracture intersects a pre-existing natural fracture, it can either follow along the natural fracture or cut right through it, depending on various factors such as the angle of the natural fracture relative to the hydraulic fracture, the normal stress acting on the natural fracture, the fluid pressure in the hydraulic fracture, the viscosity of the fracturing fluid, the rock mechanical properties, the natural fracture conductivity, and possibly other factors. The hydraulic fracture may also follow the natural fracture for some distance and then branch off again in its preferred direction. If these conditions prevail throughout the formation, the created hydraulic fracture system may be very complex as shown in FIG. 1, or may be as illustrated in FIG. 2.

Figure 2:
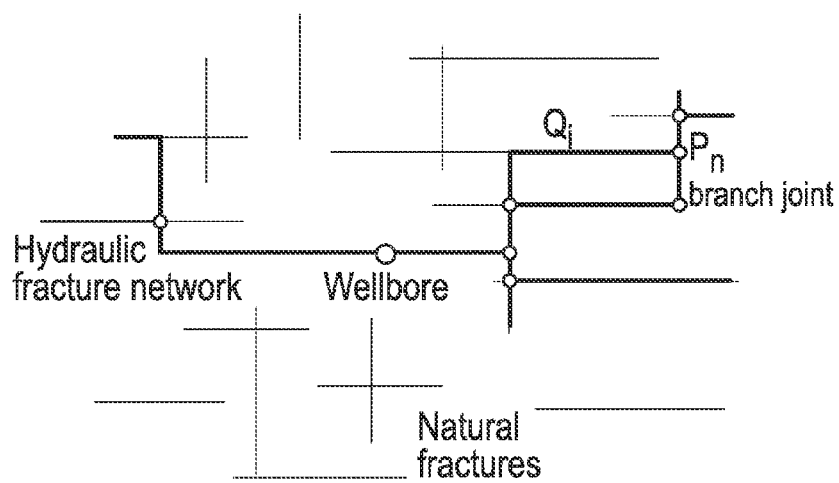
FIG. 2 is an illustration of created hydraulic fracture network in a naturally fractured formation.
Figure 3:
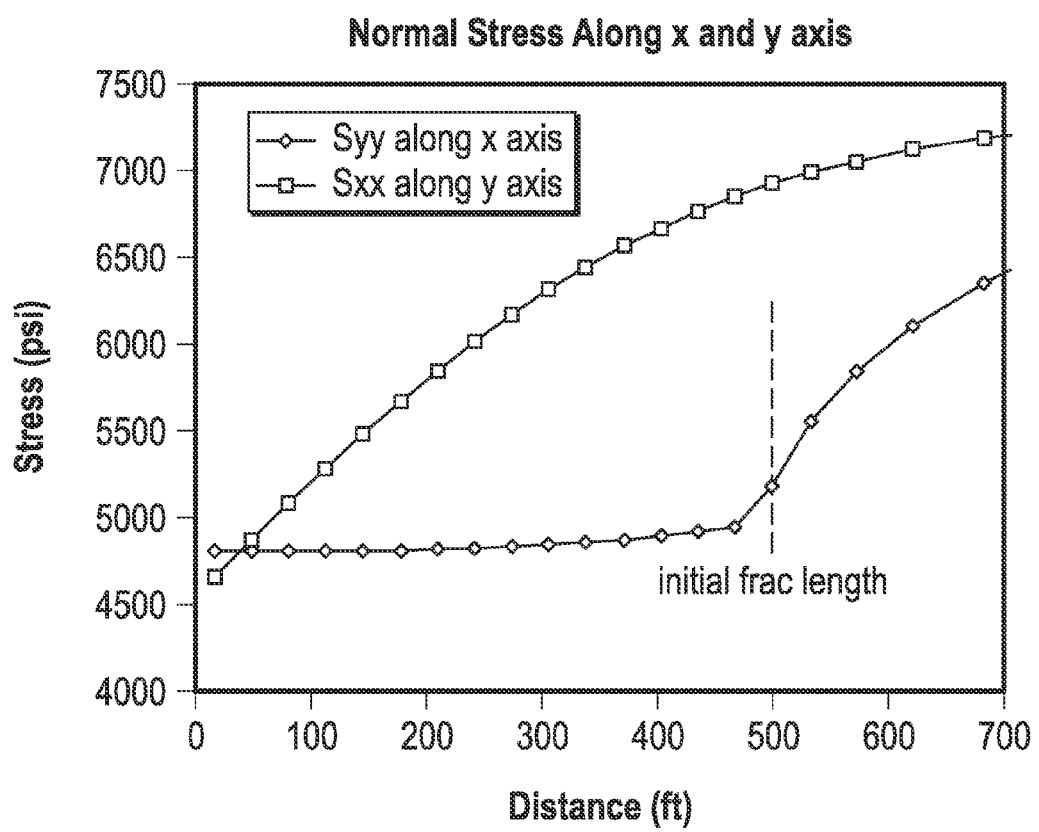
FIG. 3 is a graph of stress distribution along fracture paths for the example simulation.

Two major difficulties may be encountered in attempting to model a hydraulic fracture system as depicted in FIG. 2. The first is the path for the hydraulic fracture to follow when it intersects a natural fracture. Detailed analysis of the stresses near the hydraulic fracture tip and the natural fracture intersection, as well as the opening or slippage of the natural fracture faces, is needed to determine whether the hydraulic fracture will propagate through or terminate. The second difficulty is in the solution of the set of highly non-linear equations governing the fracture opening and the fluid flow in the fracture system with jointed branches. Due to the non-linearity of the governing equations, the solution of pressure and flow distribution in the fracture is obtained through numerical iterations and is computationally intensive even for the simplest case of single planar fracture. For a branched system as shown in FIG. 2, the computation complexity increases drastically, since at each joint where multiple branches connect, the flow rate split among the branches is not known. A numerical solution method must determine the flow rates and pressure in all fracture segments, not only to satisfy the governing equations along each segment, but also to satisfy the flow rate balance at each joint and equal pressure drop along the parallel flow paths connecting the joints.

For a complex fracture system such as that shown in FIG. 2, a full planar 3D model is impractical at this time since computation time required is so large that it will be of little practical use; however, in the future, such models may become more practical. The models currently used in accordance with methods of the invention are simpler 2D or P3D type fracture models to allow the solution in a reasonable computation time. In one specific embodiment, the 2D PKN type model is used, which renders the mathematical problem much simpler to solve. In a 2D PKN model, a constant fracture height H is assumed. This assumption is valid if the fracture is expected to be contained in the formation being treated without significant height growth. For any fracture segment, the governing equations that relate the flow rate in the fracture Q, the pressure p and the fracture opening width w are given as follows:

$$\text{Flow equation: } -\frac{dp}{ds} = 2k\left(\frac{4n+2}{n}\right)^n \left(\frac{Q}{H}\right)^n \Phi \frac{1}{w^{2n+1}}$$

$$\text{Elasticity: } w = \frac{(p-\sigma(s))2H}{E'}$$

$$\text{Mass balance: } \frac{\partial}{\partial s}\left(\frac{Q}{H}\right) + \frac{\partial w}{\partial t} + 2v_l = 0$$

In these equations, s is the distance, n and k are the fluid rheology properties, $\Phi$ is shape factor, $\sigma$ is the normal stress acting on the fracture and can vary along the fracture, and $v_l$ is the fluid leakoff velocity. These equations are the same as the conventional PKN model, except that the stress $\sigma$ is assumed constant in the conventional PKN model.

In accordance with some embodiments of the invention, the model operates by dividing the fracture segments into small elements to form a fracture grid. The treatment is simulated in small time increments, with the fracture branches growing in length in small steps. Such time increments usually consist of a mere second to several minutes in length, typically no more than about five or ten minutes, but could be designed to be up to thirty minutes or more if desired. At each time step, the flow rate and pressure distribution throughout the fracture system are solved to satisfy the governing deformation and flow equations, the boundary conditions at the tips of the propagating branches and at the wellbore, and the continuity, and flow rate balance at each joint. The solution can be obtained through using an iterative scheme, similar to that used in MLF (Multi-Layer Fracture) model, such as that described by Gu, H., Desroches, J. and Elbel, J. L, "Computer Simulation of Multilayer Hydraulic Fractures," paper SPE 64789, 2000 International Conference of Oil and Gas in China, Beijing, November 7-10, or a dual-fracture refrac model described by Weng, X. and Siebrits, E., "Effect of Production-Induced Stress Field on Refracture Propagation and Pressure Response," paper SPE 106043, 2007 SPE Hydraulic Fracturing Technology Conference, College Station, January 29-31.

In some embodiments of the invention, the following solution scheme is adopted for the model used in the fracturing method. First, each propagating branch tip is allowed to advance by a small increment. The pressure and the flow rate distribution along each branch are determined from the tip or outer joint towards the next inner joint by solving the governing equations. A flow rate split among the connecting branches at each joint has to be assumed to obtain the solution. However, since the assumed flow rate split may not be the correct solution, this would result in the computed pressures at the next joint to be different along different parallel flow paths. A correction function based on the difference between the pressure for the branch and the average pressure at the joint can then be used to adjust the flow rate split among the connecting branches in the next iteration. The iteration repeats until the computed pressure drops along all parallel flow paths become equal, and until the computed flow rate at the wellbore equals to the specified pump rate.

When a propagating branch tip intersects a natural fracture, a special fracture tip-natural fracture interaction model is used to determine whether the fracture will propagate through or follow the natural fracture path. This model correlation is derived from the results of other more sophisticated numerical models that simulate the detailed hydraulic fracture-natural fracture interaction process, or derived from laboratory and field experiments.

The hydraulic fracture network model described in this invention provides a design tool to predict the dimensions and the structure of the created fracture system in a naturally fractured formation to achieve the optimal well productivity. The design process can involve the following steps:
1. Define and construct the data for the formation layers and their geomechanical properties through logs;
2. Collect all pertinent well completion and reservoir data for the design;
3. Obtain a natural fracture network description (fracture location, spacing, width, etc.) through wellbore imaging logs, core description, or natural fracture models;
4. Simulate the fracture treatment using the hydraulic fracture network model described here and the input data from the above steps; and,
5. Optimize the treatment by comparing the predicted fracture geometry against the design target, or using a production simulator that can predict the productivity increase for a naturally fractured system.

The methods of the invention are useful for subterranean formation treatment, which also includes a wellbore penetrating the formation, and include such methods as treatment fluid design, breaker schedule design, rheology representation in treatment simulators, and the like. Preferably, the embodiments of the invention are fracturing methods which include design of the fracturing fluid, design of the fracturing treatment, injection of the fracturing fluid into the wellbore, stimulating the formation, and monitoring/optimizing the fluid/treatment based upon real-time monitoring.

Methods of the invention may also be used to for real-time QA/QC of the fluids, thus making possible to adjust the fluid components during an operation to achieve a further optimized fluid and treatment schedule. The model can be used to further extrapolate monitored surface characteristics such as viscosity, pumping rate, temperature, VES concentration, polymer concentration, crosslinker concentration, breaker concentration to bottomhole or formation conditions.

Some fluids used in methods are crosslinked polymer based fluids, or linear polymer based fluids, used for treating a subterranean formation. The fluids typically include a polymer viscosifying agent and a crosslinker. Non-limiting examples of polymer viscosifiers include guar gums, high-molecular weight polysaccharides composed of mannose and galactose sugars, or guar derivatives such as hydropropyl guar (HPG), carboxymethyl guar (CMG), and carboxymethylhydroxypropyl guar (CMHPG). Cellulose derivatives such as hydroxyethylcellulose (HEC) or hydroxypropylcellulose (HPC) and carboxymethylhydroxyethylcellulose (CMHEC) may also be used. Any useful polymer may be used in either crosslinked form, or without crosslinker in linear form. Xanthan, diutan, and scleroglucan, three biopolymers, have been shown to be useful as viscosifying agents. Synthetic polymers such as, but not limited to, polyacrylamide and polyacrylate polymers and copolymers are used typically for high-temperature applications. Also, associative polymers for which viscosity properties are enhanced by suitable surfactants and hydrophobically modified polymers can be used, such as cases where a charged polymer in the presence of a surfactant having a charge that is opposite to that of the charged polymer, the surfactant being capable of forming an ion-pair association with the polymer resulting in a hydrophobically modified polymer having a plurality of hydrophobic groups, as described published U.S. Pat. App. No. US 2004209780, Harris et. al.

When incorporated, the polymer viscosifier may be present at any suitable concentration. In various embodiments hereof, the viscosifying agent can be present in an amount of up to less than about 60 pounds per thousand gallons of liquid phase, or from about 15 to less than about 40 pounds per thousand gallons, from about 15 to about 35 pounds per thousand gallons, 15 to about 25 pounds per thousand gallons, or even from about 17 to about 22 pounds per thousand gallons. Generally, the viscosifying agent can be present in an amount of from about 1 to less than about 50 pounds per thousand gallons of liquid phase, with a lower limit of polymer being no less than about 1, 2, 3, 4, 5, 6, 7, 8, 9, 10, 11, 12, 13, 14, 15, 16, 17, 18, or 19 pounds per thousand gallons of the liquid phase, and the upper limited being less than about 50 pounds per thousand gallons, no greater than 59, 54, 49, 44, 39, 34, 30, 29, 28, 27, 26, 25, 24, 23, 22, 21, or 20 pounds per thousand gallons of the liquid phase. In some embodiments, the polymers can be present in an amount of about 20 pounds per thousand gallons. Hydroxypropyl guar, carboxymethyl hydroxypropyl guar, carboxymethyl guar, cationic functional guar, guar or mixtures thereof, are preferred polymers for use herein as a gelling agent. Fluids incorporating polymer viscosifiers may have any suitable viscosity depending upon the particular needs of a given operation. For many operations, the fluids preferably have a viscosity value of about 50 mPa-s or greater at a shear rate of about 100 s$^{-1}$ at treatment temperature, more preferably about 75 mPa-s or greater at a shear rate of about 100 s$^{-1}$, and even more preferably about 100 mPa-s or greater. In the case of a slickwater fracturing, also commonly referred to as a water fracture operation, the fluid may have suitably low, but effective, viscosity values, and low polymer loadings, preferably less than about 15 pounds per thousand gallons, more preferably from about 1 to about 10 pounds per thousand gallons.

Incorporating crosslinkers into the fluids further augments the viscosity of the treatment fluid. Crosslinking consists of the attachment of two polymeric chains through the chemical association of such chains to a common element or chemical group, whereas such element or group is referred to as the crosslinker. Typical crosslinkers are polyvalent metal ions, more often zirconium or titanium ions, or borate ions. Crosslinking is very sensitive to the prevailing pH. For example, crosslinking with borate ions can be performed only in alkaline media (pH>8). pH-regulating systems ("buffers") are often required to achieve effective crosslinking with metal ions.

Fluids used in the invention may be based upon and aqueous or nonaqueous medium, or even gelled oil. When the fluid is based upon an aqueous medium, the medium may be water or brine. In those embodiments of the invention where the aqueous medium is a brine, the brine is water comprising inorganic salts and/or organic salts. Preferred inorganic salts include alkali metal halides, more preferably potassium chloride. The carrier brine phase may also comprise an organic salt more preferably sodium or potassium formate. Preferred inorganic divalent salts include calcium halides, more preferably calcium chloride or calcium bromide. Sodium bromide, potassium bromide, or cesium bromide may also be used. The salt is chosen for compatibility reasons i.e. where the reservoir drilling fluid used a particular brine phase and the completion/clean up fluid brine phase is chosen to have the same brine phase.

A fiber component may be included in the fluids of the invention to achieve a variety of properties including improving particle suspension, and particle transport capabilities, and gas phase stability. Fibers used may be hydrophilic or hydrophobic in nature, but hydrophilic fibers are preferred. Fibers can be any fibrous material, such as, but not necessarily limited to, natural organic fibers, comminuted plant materials, synthetic polymer fibers (by non-limiting example polyester, polyaramide, polyamide, novoloid or a novoloid-type polymer), fibrillated synthetic organic fibers, ceramic fibers, inorganic fibers, metal fibers, metal filaments, carbon fibers, glass fibers, ceramic fibers, natural polymer fibers, and any mixtures thereof. Particularly useful fibers are polyester fibers coated to be highly hydrophilic, such as, but not limited to, DACRON® polyethylene terephthalate (PET) Fibers available from Invista Corp. Wichita, Kans., USA, 67220. Other examples of useful fibers include, but are not limited to, polylactic acid polyester fibers, polyglycolic acid polyester fibers, polyvinyl alcohol fibers, and the like. When used in fluids of the invention, the fiber component may be include at concentrations from about 1 to about 15 grams per liter of the liquid phase of the fluid, preferably the concentration of fibers are from about 2 to about 12 grams per liter of liquid, and more preferably from about 2 to about 10 grams per liter of liquid.

Fluids used in accordance with the invention may also comprise a breaker. The purpose of this component is to "break" or diminish the viscosity of the fluid so that this fluid is more easily recovered from the formation during cleanup. With regard to breaking down viscosity, oxidizers, enzymes, or acids may be used. Breakers reduce the polymer's molecular weight by the action of an acid, an oxidizer, an enzyme, or some combination of these on the polymer itself. In the case of borate-crosslinked gels, increasing the pH and therefore increasing the effective concentration of the active crosslinker, the borate anion, reversibly create the borate crosslinks. Lowering the pH can just as easily eliminate the borate/polymer bonds. At a high pH above 8, the borate ion exists and is available to crosslink and cause gelling. At lower pH, the borate is tied up by hydrogen and is not available for crosslinking, thus gelation caused by borate ion is reversible.

In some embodiments of the invention, a viscoelastic surfactant (VES) is used as a viscosifying agent. The VES may be selected from the group consisting of cationic, anionic, zwitterionic, amphoteric, nonionic and combinations thereof. Some nonlimiting examples are those cited in U.S. Pat. No. 6,435,277 (Qu et al.) and U.S. Pat. No. 6,703,352 (Dahayanake et al.), each of which are incorporated herein by reference. The viscoelastic surfactants, when used alone or in combination, are capable of forming micelles that form a structure in an aqueous environment that contribute to the increased viscosity of the fluid (also referred to as "viscosifying micelles"). These fluids are normally prepared by mixing in appropriate amounts of VES suitable to achieve the desired viscosity. The viscosity of VES fluids may be attributed to the three dimensional structure formed by the components in the fluids. When the concentration of surfactants in a viscoelastic fluid significantly exceeds a critical concentration, and in most cases in the presence of an electrolyte, surfactant molecules aggregate into species such as micelles, which can interact to form a network exhibiting viscous and elastic behavior.

Nonlimiting examples of suitable viscoelastic surfactants useful for viscosifying some fluids include cationic surfactants, anionic surfactants, zwitterionic surfactants, amphoteric surfactants, nonionic surfactants, and combinations thereof.

Fluids used in methods of the invention may further contain other additives and chemicals that are known to be commonly used in oilfield applications by those skilled in the art. These include, but are not necessarily limited to, materials such as surfactants, foaming agents, crosslinking delay agent, breaker delay agents, particles, proppants, gas component, breaker aids, oxygen scavengers, alcohols, scale inhibitors, corrosion inhibitors, fluid-loss additives, bactericides, friction reducers, latexes, emulsions, emulsifiers, and the like.

When incorporated, any proppant (gravel) can be used, provided that it is compatible with the base and the bridging-promoting materials if the latter are used, the formation, the fluid, and the desired results of the treatment. Such proppants (gravels) can be natural or synthetic, coated, or contain chemicals; more than one can be used sequentially or in mixtures of different sizes or different materials. Proppants and gravels in the same or different wells or treatments can be the same material and/or the same size as one another and the term "proppant" is intended to include gravel in this discussion. In general the proppant used will have an average particle size of from about 0.15 mm to about 2.5 mm, more particularly, but not limited to typical size ranges of about 0.25-0.43 mm, 0.43-0.85 mm, 0.85-1.18 mm, 1.18-1.70 mm, and 1.70-2.36 mm. Normally the proppant will be present in the slurry in a concentration of from about 0.12 kg proppant added to each L of carrier fluid to about 3 kg proppant added to each L of carrier fluid, preferably from about 0.12 kg proppant added to each L of carrier fluid to about 1.5 kg proppant added to each L of carrier fluid.

Embodiments of the invention may also include placing proppant particles that are substantially insoluble in the fluids of the formation. Proppant particles carried by the treatment fluid remain in the fracture created, thus propping open the fracture when the fracturing pressure is released and the well is put into production. [Any proppant (gravel) can be used, provided that it is compatible with the base and the bridging-promoting materials if the latter are used, the formation, the fluid, and the desired results of the treatment. Such proppants (gravels) can be natural or synthetic, coated, or contain chemicals; more than one can be used sequentially or in mixtures of different sizes or different materials. Proppants and gravels in the same or different wells or treatments can be the same material and/or the same size as one another and the term "proppant" is intended to include gravel in this discussion. Proppant is selected based on the rock strength, injection pressures, types of injection fluids, or even completion design. Preferably, the proppant materials include, but are not limited to, sand, sintered bauxite, glass beads, ceramic materials, naturally occurring materials, or similar materials. Mixtures of proppants can be used as well. Naturally occurring materials may be underived and/or unprocessed naturally occurring materials, as well as materials based on naturally occurring materials that have been processed and/or derived. Suitable examples of naturally occurring particulate materials for use as proppants include, but are not necessarily limited to: ground or crushed shells of nuts such as walnut, coconut, pecan, almond, ivory nut, brazil nut, etc.; ground or crushed seed shells (including fruit pits) of seeds of fruits such as plum, olive, peach, cherry, apricot, etc.; ground or crushed seed shells of other plants such as maize (e.g., corn cobs or corn kernels), etc.; processed wood materials such as those derived from woods such as oak, hickory, walnut, poplar, mahogany, etc., including such woods that have been processed by grinding, chipping, or other form of particalization, processing, etc, some nonlimiting examples of which are proppants supplied by BJ Services Co., made of walnut hulls impregnated and encapsulated with resins. Further information on some of the above-noted compositions thereof may be found in Encyclopedia of Chemical Technology, Edited by Raymond E. Kirk and Donald F. Othmer, Third Edition, John Wiley & Sons, Volume 16, pages 248-273 (entitled "Nuts"), Copyright 1981, which is incorporated herein by reference.

Techniques for hydraulically fracturing a subterranean formation will be known to persons of ordinary skill in the art, and will involve pumping the fracturing fluid into the borehole and out into the surrounding formation. The fluid pressure is above the minimum in situ rock stress, thus creating or extending fractures in the formation. See Stimulation Engineering Handbook, John W. Ely, Pennwell Publishing Co., Tulsa, Okla. (1994), U.S. Pat. No. 5,551,516 (Normal et al.), "Oilfield Applications", Encyclopedia of Polymer Science and Engineering, vol. 10, pp. 328-366 (John Wiley & Sons, Inc. New York, N.Y., 1987) and references cited therein, the disclosures of which are incorporated herein by reference thereto.

In most cases, a hydraulic fracturing consists of pumping a proppant-free viscous fluid, or pad, usually water with some fluid additives to generate high viscosity, into a well faster than the fluid can escape into the formation so that the pressure rises and the rock breaks, creating artificial fractures and/or enlarging existing fractures. Then, proppant particles are added to the fluid to form a slurry that is pumped into the fracture to prevent it from closing when the pumping pressure is released. The proppant suspension and transport ability of the treatment base fluid traditionally depends on the type of viscosifying agent added. The use of the aqueous energized fluids according to the invention diminishes the single dominance of the viscosifying agent on proppant suspension and transport ability, as well as improves proppant suspension and transport ability at elevated temperatures in excess of about 93° C., and particularly at temperatures in excess of about 121° C.

In the fracturing treatment, fluids be used in the pad treatment, the proppant stage, or both. The components of the liquid phase are preferably mixed on the surface. Alternatively, a the fluid may be prepared on the surface and pumped down tubing while the gas component could be pumped down the annular to mix down hole, or vice versa.

Example

To illustrate the method described in this invention for modeling hydraulic fracture process in a naturally fractured formation, a specific example of two intersecting hydraulic fractures as the simplest form of fracture network is presented. The two fractures are divided into small grids as described in paragraph 22 and the equations as given in paragraph 25 are solved at each time increment.

In this specific example, a pre-existing, non-uniform stress field is introduced as a result of production from an existing propped hydraulic fracture. The dual fracture model simulates a refracture treatment, in which a primary fracture propagates parallel to the initial propped fracture and a secondary fracture propagates orthogonal to the primary fracture. The normal stress distribution along the primary fracture (x axis) and the orthogonal fracture (y axis) are shown in FIG. 4.

Additional fracture parameters used in the simulation are listed below:

| | |
|---|---|
| Young's modulus | $3 \times 10^6$ psi |
| Poisson's ratio | 0.25 |
| Fluid viscosity | 100 cp |
| Leakoff coefficient | 0.002 ft/√min |
| Pump rate | 30 bpm |
| Pump time | 90 min |

Figure 4:
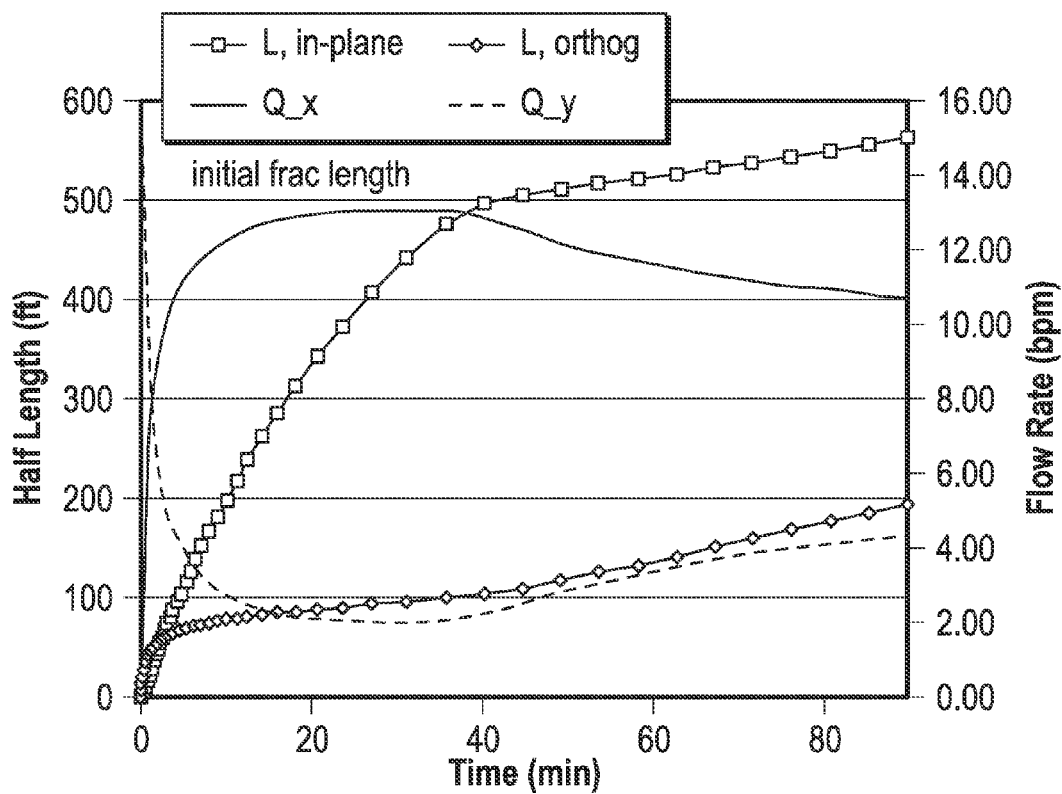
FIG. 4 shows simulated fracture length and flow rate history for the example simulation.
Figure 5:
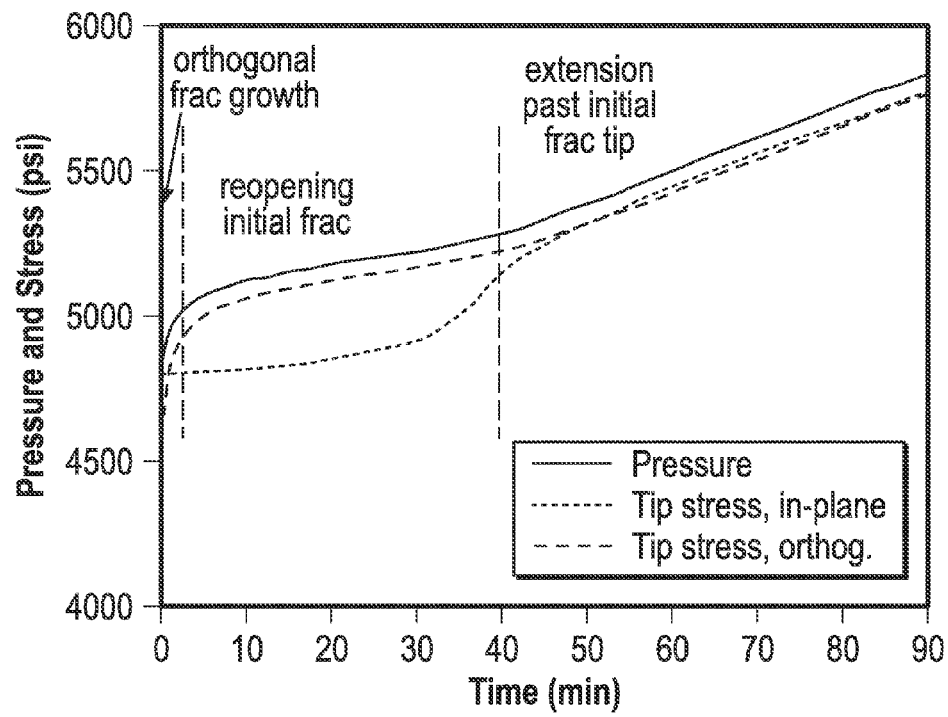
FIG. 5 shows simulated pressure history for the example simulation.

The predicted fracture length and flow rate history and the pressure response are shown in FIGS. 4 and 5, respectively. Due to the lower normal stress along the y axis near the wellbore, the orthogonal fracture is first initiated. In the first minute of pumping, the fluid predominantly goes into the orthogonal fracture. However, as the orthogonal fracture penetrates deeper into the formation, the stress at the tip of the fracture increases rapidly, causing the pumping pressure to increase rapidly as seen in FIG. 5. This consequently leads to the opening and growth of the parallel fracture along the x-axis when the pressure exceeds the normal stress.

The example above shows how the method described in this invention is used to simulate two intersecting hydraulic fractures. The model can be extended to simulate a primary hydraulic fracture intersecting many intersecting fractures, representing the natural fracture joints in the formation. It can further be extended to the more complex fracture network as shown in FIG. 2.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method of performing a fracture treatment, said method comprising:
   acquiring subterranean formation layer geomechanical properties;
   providing pumping parameters for fracturing the subterranean formation;
   predicting a propagation of a network of fractures in the formation, and a flow rate and pressure distribution throughout the network of fractures based on the acquired geomechanical properties and the pumping parameters;
   designing a fracturing fluid and a fracturing treatment schedule based upon the predicting; and,
   injecting the fracturing fluid into a wellbore according to the fracturing treatment schedule.

2. The method of claim 1, wherein the geomechanical properties include at least one of an elasticity property of the formation and a deformation property of the formation.

3. The method of claim 1, further comprising predicting if each fracture will grow and in which direction the fracture will branch.

4. The method of claim 1, wherein the predicting comprises solving governing deformation and flow equations.

5. The method of claim 1, further comprising inputting the geomechanical properties of the formation into a model.

6. The method of claim 5, wherein the model is selected from the group consisting of a 2D Perkins-Kern-Nordren (2D PKN) model, a Radial (RAD) model, a planar 3D model, a Khristianovich-Geertsma-de Klerk (KGD) model, a Pseudo-3D (P3D) model, and a full 3D model.

7. The method of claim 1, wherein predicting the propagation of the network of fractures further comprises dividing at least one fracture segment of the network of fractures into a plurality of elements to form a fracture grid.

8. The method of claim 1, wherein predicting the propagation of the network of fractures is performed before or during the fracture treatment, and achieved by modeling progression of the fracture in small time increments with the fracture growing in length in small steps.

9. The method of claim 8, wherein said predicting further comprises, at each time increment, solving the flow rate and pressure distribution throughout the network of fractures to further satisfy boundary conditions at tips of propagating branches and at a wellbore communicating with the subterranean formation, and the continuity, and flow rate balance at each joint connecting more than one branch.

10. The method of claim 1, further comprising using a production simulator to predict productivity increase for the subterranean formation.

11. The method of claim 1, further comprising selecting an optimum fracturing fluid composition to achieve a fracture propagation objective.

12. The method of claim 1, wherein the subterranean formation comprises a natural fracture network.

13. The method of claim 12, further comprising providing a description of the natural fracture network.

14. The method of claim 1, wherein pumping parameters comprise at least one of a pump rate and pump time.

15. A method of fracturing a subterranean formation, the method comprising:
   inputting a geomechanical property of the formation into a model;
   inputting pumping parameters for fracturing the subterranean formation into the model;
   simulating a propagation of a network of fractures in the formation;
   predicting a flow rate and pressure distribution throughout the network of fractures based on the acquired geomechanical properties and the pumping parameters;
   designing a fracturing fluid and a fracturing treatment schedule based upon the predicting; and,
   injecting the fracturing fluid into a wellbore according to the fracturing treatment schedule.

16. The method of claim 15, wherein the geomechanical property includes at least one of an elasticity property of the formation and a deformation property of the formation.

17. The method of claim 15, further comprising predicting if each fracture will grow and in which direction the fracture will branch.

18. The method of claim 15, further comprising selecting an optimum fracturing fluid to achieve the simulated fracture propagation result.

19. The method of claim 15, further comprising fracturing the subterranean formation.

20. The method of claim 15, wherein the model is selected from the group consisting of a 2D Perkins-Kern-Nordren (2D PKN) model, a Radial (RAD) model, a planar 3D model, a Khristianovich-Geertsma-de Klerk (KGD) model, a Pseudo-3D (P3D) model, and a full 3D model.

21. The method of claim 15, wherein said simulating is performed before or during the fracture treatment, and achieved by modeling progression of the fracture in small time increments with fracture growing in length in small steps.

22. The method of claim 21, wherein said simulating further comprising, at each time increment, solving the flow rate and pressure distribution throughout a fracture system to satisfy boundary conditions at tips of propagating branches and at a wellbore communicating with the subterranean formation, and the continuity, and flow rate balance at each joint connecting more than one branch.

23. The method of claim 15, wherein said predicting further comprises solving governing deformation and flow equations.

24. The method of claim 15, wherein said simulating further comprises dividing at least one fracture segment of the network of fractures into a plurality of elements to form a fracture grid.

25. The method of claim 15, further comprising using a production simulator to predict productivity increase for the subterranean formation.

26. The method of claim 15, wherein the subterranean formation is a natural fracture network.

27. The method of claim 26, further comprising inputting a description of the natural fracture network into the model.

* * * * *